(12) United States Patent
Cho et al.

(10) Patent No.: US 9,800,261 B2
(45) Date of Patent: Oct. 24, 2017

(54) THIRD ORDER LOOP FILTER AND DELTA-SIGMA MODULATOR INCLUDING THE THIRD ORDER LOOP FILTER

(71) Applicant: ELECTRONICS AND TELECOMMUNICATIONS RESEARCH INSTITUTE, Daejeon (KR)

(72) Inventors: Young Kyun Cho, Daejeon (KR); Bong Hyuk Park, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/405,628

(22) Filed: Jan. 13, 2017

(65) Prior Publication Data

US 2017/0207796 A1 Jul. 20, 2017

(30) Foreign Application Priority Data

Jan. 20, 2016 (KR) .................. 10-2016-0007134

(51) Int. Cl.
*H03M 3/00* (2006.01)
*H03H 11/12* (2006.01)
(52) U.S. Cl.
CPC ........ *H03M 3/454* (2013.01); *H03H 11/1204* (2013.01); *H03H 11/1291* (2013.01); *H03M 3/422* (2013.01); *H03M 3/464* (2013.01)
(58) Field of Classification Search
CPC ....... H03M 3/454; H03M 3/464; H03M 3/422

USPC ......................... 341/144, 143, 155
See application file for complete search history.

(56) References Cited

U.S. PATENT DOCUMENTS

| 5,243,345 A | 9/1993 | Naus et al. |
| 6,967,606 B2 | 11/2005 | Wiesbauer et al. |
| 8,258,990 B2 | 9/2012 | Dosho et al. |
| 8,749,414 B2 | 6/2014 | Cho et al. |
| 2012/0161990 A1* | 6/2012 | Dosho .................... G06G 7/186 341/110 |
| 2015/0229292 A1 | 8/2015 | Cheo et al. |
| 2016/0380646 A1* | 12/2016 | Kauffman ............. H03M 3/444 341/118 |

FOREIGN PATENT DOCUMENTS

| KR | 10-2009-0114706 A | 11/2009 |
| KR | 10-2015-0094906 A | 8/2015 |

OTHER PUBLICATIONS

Young-Kyun Cho et al., "Single op-amp second-order loop filter for continuous-time delta-sigma modulators", Electronics Letters vol. 51 No. 8 pp. 619-621, Apr. 2015.
Ramin Zanbaghi et al., "An 80-dB DR, 7.2-MHz Bandwidth Single Opamp Biquad Based CT ΔΣ Modulator Dissipating 13.7-mW", IEEE Journal of Solid-State Circuits, vol. 48, No. 2, Feb. 2013.

(Continued)

*Primary Examiner* — Peguy Jean Pierre
(74) *Attorney, Agent, or Firm* — LRK Patent Law Firm (57) ABSTRACT

A third-order loop filter for a delta signal modulator comprises a single operational amplifier, and a resistor-capacitor network including a plurality of capacitors and a plurality of resistors which are connected to the operational amplifier, and satisfy a third-order transfer function.

16 Claims, 9 Drawing Sheets

(56) References Cited

OTHER PUBLICATIONS

Kazuo Matsukawa et al., "A 10 MHz BW 50 fJ/conv. continuous time ΔΣ modulator with high-order single opamp integrator using optimization-based design method", 2012 Symposium on VLSI Circuits Digest of Technical Papers, Jan. 2012.

Kazuo Matsukawa et al., "A Fifth-Order Continuous-Time Delta-Sigma Modulator With Single-Opamp Resonator", IEEE Journal of Solid-State Circuits, vol. 45, No. 4, Apr. 2010.

* cited by examiner

THIRD ORDER LOOP FILTER AND DELTA-SIGMA MODULATOR INCLUDING THE THIRD ORDER LOOP FILTER

CROSS-REFERENCE TO RELATED APPLICATIONS

This application claims priority to Korean Patent Application No. 2016-0007134, filed Jan. 20, 2016 in the Korean Intellectual Property Office (KIPO), the entire content of which is hereby incorporated by reference.

BACKGROUND

1. Field of the Invention

The present disclosure relates to a loop filter, and more particularly, to a loop filter for a continuous-time delta sigma modulator (DSM.)

2. Description of Related Art

A continuous-time delta signal modulator is a data converter which is widely used for realization of high efficiency in a wireless communication system such as a $3^{rd}$ Generation Partnership Project (3GPP) Long Term Evolution (LTE) and a Worldwide Interoperability for Microwave Access (WiMax), according to its anti-aliasing characteristics and high signal-to-noise ratio (SNR). Currently, advancement of manufacturing technologies and increased interests on low-power consumption cause much effort to design low-power delta sigma modulators.

Among blocks constituting a delta sigma modulator, a loop filter is a block which consumes the most power. Therefore, it's required to reduce power consumption and size of the loop filter by designing an enhanced structure of the loop filter. With respect to the design of the loop filter, various structures for the loop filter, which can reduce power consumption and size of the loop filter by configuring a second-order loop filter with a single operational (OP) amplifier, have been introduced. For reference, Korean patent publication No. 10-2015-0094906 disclosed a method for configuring a second-order loop filter using a single OP amplifier.

However, there are not examples in which a third-order loop filter is implemented using a single OP amplifier. It is not easy to find out a circuit configuration satisfying a third-order transfer function by using connections of resistors and capacitors when the order of the loop filter is 3 or above. Also, it is very difficult to provide a loop filter stable for changes in capacitances and resistances due to manufacturing tolerances.

SUMMARY

Accordingly, exemplary embodiments of the present disclosure are provided to substantially obviate one or more problems due to limitations and disadvantages of the related art.

Exemplary embodiments of the present disclosure provide technical solutions for implementing a third order loop filter by using a single operational amplifier.

Technical objects of the present disclosure are not limited to the aforementioned technical objects and other technical objects which are not mentioned will be apparently appreciated by those skilled in the art from the following description.

In order to achieve the above-described objective, an aspect of the present disclosure provides a third-order loop filter comprising an operational amplifier; and a resistor-capacitor network including a plurality of capacitors and a plurality of resistors which are connected to the operational amplifier and satisfy a third order transfer function.

The resistor-capacitor network may include, between an input end and an output end of the operational amplifier, a first capacitor, a second capacitor, and a third capacitor which are connected in series from the input end to the output end.

Also, the resistor-capacitor network may include a first resistor, a second resistor, a third resistor, a fourth resistor, a fifth resistor, and a sixth resistor which are connected in series or in parallel to a first node and a second node, the first node is a node between the first capacitor and the second capacitor, and the second node is a node between the second capacitor and the third capacitor.

Also, the first resistor is connected between the first node and a ground, the second resistor is connected between the second node and a ground, an input positive voltage signal is applied to the first node through the sixth resistor, an output positive voltage signal is applied to the first node through the fourth resistor, an input negative voltage signal is applied to the first node through the fifth resistor, and an output negative voltage signal is applied to the second node through the third resistor.

Also, at least one of the first capacitor, second capacitor, and third capacitor may be a variable capacitor, and at least one of the first resistor, second resistor, third resistor, fourth resistor, fifth resistor, and sixth resistor may be a variable resistor.

Also, a resonance condition may be controlled by varying the second capacitor and the third capacitor, or variation of the third resistor and the fourth resistor.

Also, coefficients of the transfer function may be controlled by varying the variable resistor.

Also, a second-order term in a numerator of the transfer function may be controlled by varying the fifth resistor and the sixth resistor, a first-order term in the numerator may be controlled by varying the first resistor and the sixth resistor, a constant term in the numerator may be controlled based on the first resistor and the fifth resistor, and a first-order term in a denominator in the transfer function may be controlled by varying the third resistor and the fourth resistor.

Also, the variable capacitor may comprise a plurality of capacitors based on same unit capacitance, which are connected in parallel and include a basic capacitor and at least one compensating capacitor, and at least one switch which is located in at least one of one end and another end of the at least one compensating capacitor.

In order to achieve the above-described objective, another aspect of the present disclosure provides a delta sigma modulator comprising a third-order loop filter; a comparator for comparing an output positive signal with an output negative signal of the third-order loop filter; and a digital-to-analog converter for outputting a reference positive current and a reference negative current to the third-order loop filter according to comparison result of the comparator. Also, the third-order loop filter may comprise an operational amplifier; and a resistor-capacitor network located between an input end and an output end of the operational amplifier. The resistor-capacitor network may include a first capacitor, a second capacitor, and a third capacitor which are connected in series from the input end to the output end, and a first resistor, a second resistor, a third resistor, a fourth resistor, a fifth resistor, and a sixth resistor which are connected to a first node and a second node in series or in parallel. Also, the first node is a node between the first capacitor and the second capacitor, and the second node is a node between the second capacitor and the third capacitor.

According to the technical solutions provided in the present disclosure, implementation of a third-order loop filter using a single operation amplifier can be made possible. Also, three integrators may be implemented with a single operational amplifier by using the third-order loop filter, and accordingly reduction of power consumption and circuit size can be achieved.

Also, respective coefficients of a third-order transfer function can be controlled independently through different components.

Also, by implementing a third-order integrator as a single loop filter, signal delays caused by the integrator can be reduced so that delay time compensation can be simplified in applications of communication systems.

Also, it can become easy to control changes of STF/NTF characteristics of the loop filter according to variations of process, voltage, and temperature (PVT).

Also, capacitor rows and resistor rows can be arranges in the same space with a dense structure so that matching characteristics between elements can be enhanced and gain of circuit size can be obtained.

BRIEF DESCRIPTION OF DRAWINGS

Exemplary embodiments of the present disclosure will become more apparent by describing in detail exemplary embodiments of the present disclosure with reference to the accompanying drawings, in which.

DETAILED DESCRIPTION OF EXEMPLARY EMBODIMENTS

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. Also, descriptions of functions and constructions that are well known to one of ordinary skill in the art may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Combinations of respective blocks in an accompanying block diagram and respective operations in a flowchart may be performed by computer program instructions. These computer program instructions can be mounted on a processor of a general purpose computer, a special purpose computer, or other programmable data processing equipment, and thus the instructions performed by the processor of the computer or other programmable data processing equipment generate a means for performing functions described in the respective blocks of the block diagram or the respective operations of the flowchart. To implement functions in a specific way, these computer program instructions can be stored in a computer-usable or computer-readable memory capable of aiming for a computer or other programmable data processing equipment, so that the instructions stored in the computer-usable or computer-readable memory can also produce a manufactured item including an instruction means for performing functions described in the respective blocks of the block diagram or the respective operations of the flowchart.

In addition, each block or operation may indicate a part of a module, a segment or a code including one or more executable instructions for executing specific logical function(s). It should be noted that mentioned functions described in blocks or operations can be executed out of order in some alternative embodiments. For example, two consecutively shown blocks or operations can be performed substantially at the same time, or can be performed in a reverse order according to the corresponding functions.

Hereinafter, exemplary embodiments according to the present disclosure will be described in detail by referring to accompanying drawings. However, the exemplary embodiments according to the present disclosure may be changed into various forms, and thus the scope of the present disclosure is not limited to the exemplary embodiments which will be described. The exemplary embodiments are provided to assist the one of ordinary skill in the art. In gaining a comprehensive understanding of the methods, apparatuses, and/or systems described herein.

Figure 1:
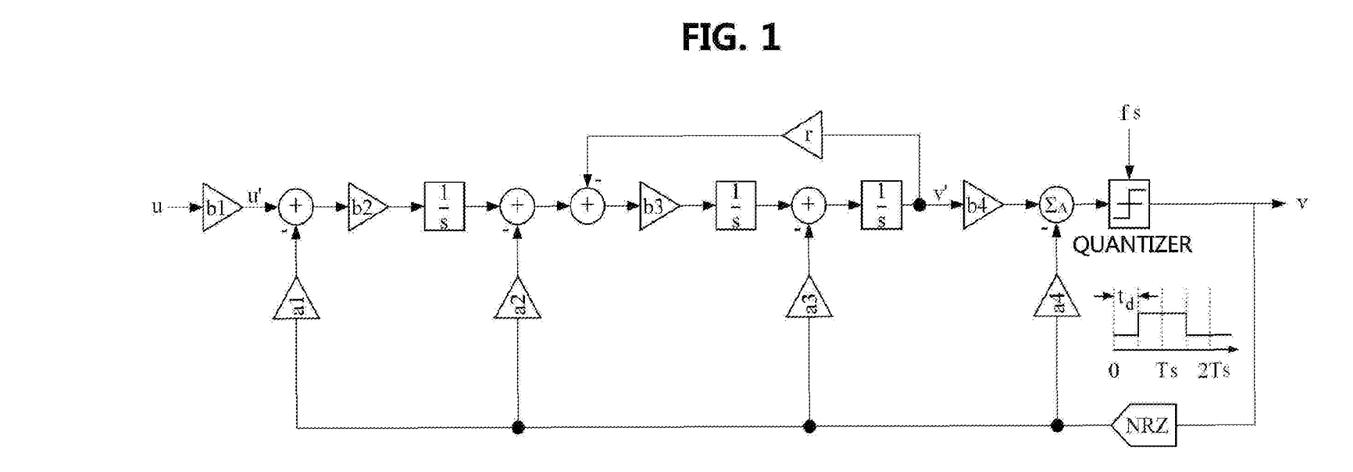
FIG. 1 is a block diagram illustrating a signal flow in a feedback-type third-order continuous-time delta sigma modulator.

FIG. 1 is a block diagram illustrating a signal flow in a feedback-type third-order continuous-time delta sigma modulator.

In the third-order continuous-time delta sigma modulator, three integrators denoted as '1/s', three digital-to-analog converters (DACs) a1, a2, and a3, and a feedback loop r for zero-optimization are used. Since non-return-to-zero (NRZ) type feedback DACs are used, a summing amplifier ΣA and a DAC a4 are additionally used to compensate an excess loop delay (ELD). In the present disclosure, implementations on a loop filer having a simplified structure are described, and thus detail description on a quantizer and the feedback DAC are omitted for convenience of explanation. Also, for convenience of explanation, in the below description, explanation will be provided based on a return-to-zero (RZ) type DAC without ELD compensation.

Figure 2:
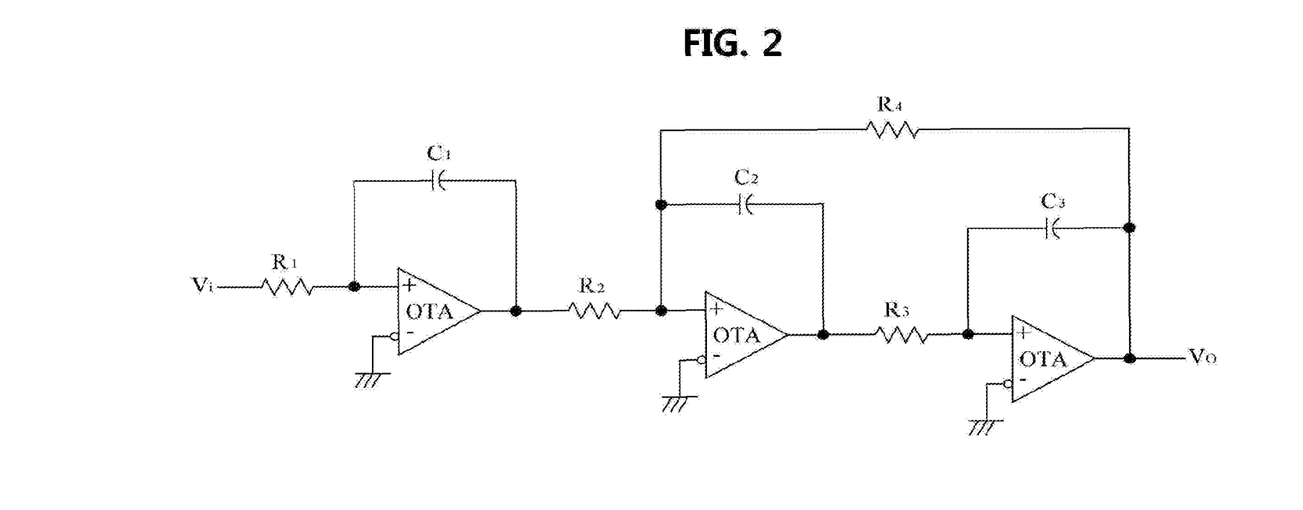
FIG. 2 is a circuit diagram of a feedback-type third-order continuous-time delta signal modulator.

FIG. 2 is a circuit diagram of a feedback-type third-order continuous-time delta signal modulator.

In order to implement the delta sigma modulator illustrated in FIG. 1 in a circuit form, a loop filter including three integrators and a zero-optimization loop may comprise three operational amplifiers, three capacitors, and four resistors, as illustrated in FIG. 2.

Figure 3:
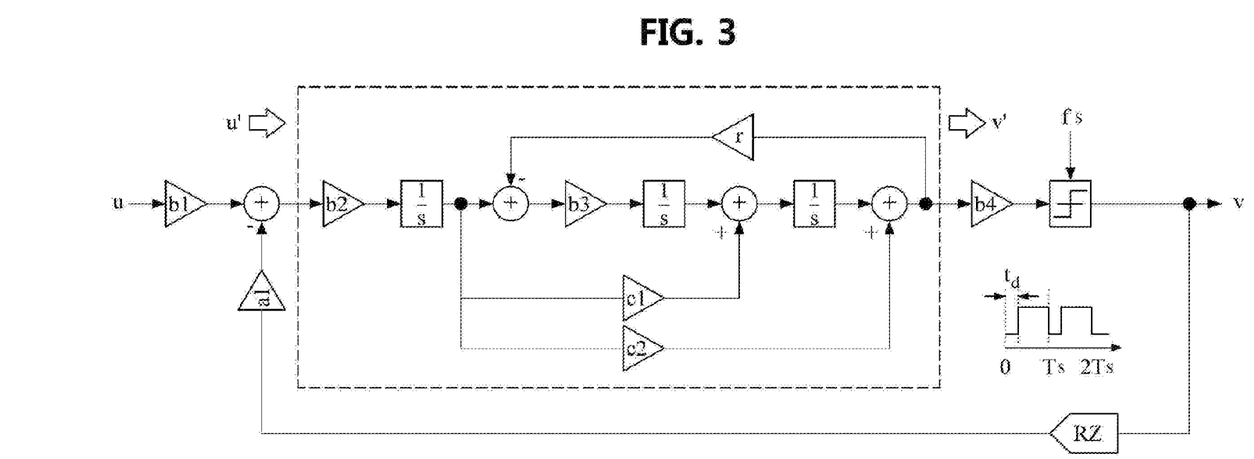
FIG. 3 is a block diagram illustrating loop substitution in a feedback-type third-order continuous-time delta sigma modulator.

FIG. 3 is a block diagram illustrating loop substitution in a feedback-type third-order continuous-time delta sigma modulator.

In the case that three operational amplifiers are used as illustrated in FIG. 2, increase of the size of the circuit and power consumption may be inevitable. Therefore, in order to reduce the size of circuit and its power consumption, the feedback loop may be substituted with a feed forward loop as illustrated in FIG. 3, and a whole loop filter may be configured as represented with a single transfer function. Since the loop filter in FIG. 1 cannot be represented with a single transfer function due to DACs giving feedbacks to outputs of respective integrators, it may be difficult to use only a single operational amplifier to implement the loop filter. However, in the case illustrated in FIG. 3, the third-order loop filter may be implemented in a single input/output form having an input u' and an output v', by changing a structure feedback signals into the feed forward structure. That is, a path a2 in FIG. 1 may be substituted with a path c1 in FIG. 3, and a path a3 in FIG. 1 may be substituted with a path c2 in FIG. 3. Therefore, a value of c1 and a value of c2 may be defined as represented in the below equation 1.

$$c1 = a2 \times b3 / (a1 \times b2)$$

$$c2 = a3 / (a1 \times b2) \qquad \text{[Equation 1]}$$

Figure 4:
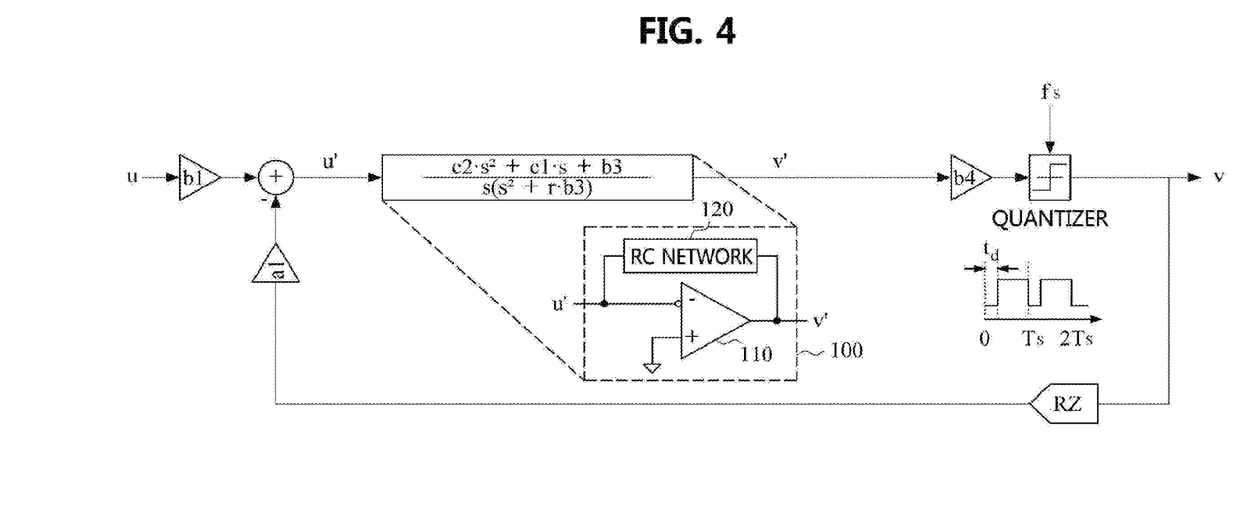
FIG. 4 is a diagram illustrating a transfer function of a loop filter in a feedback-type third-order continuous-time delta signal modulator.

FIG. 4 is a diagram illustrating a transfer function of a loop filter in a feedback-type third-order continuous-time delta signal modulator.

Through the above-described structural change shown in FIG. 3, the third-order loop filter may be represented with a single transfer function shown in FIG. 4. Accordingly, if a proper resistor-capacitor network (RC network) 120 is configured, the third-order loop filter 100 may be configured with only a single operational amplifier 110. However, it's not easy to configure the proper RC network 120. The reason is that each of a numerator and a denominator constituting the transfer function should be controlled independently to configure the RC network 120 satisfying the transfer function in FIG. 4, and the circuit should operate in a stable region even when values of respective elements vary.

Figure 5:
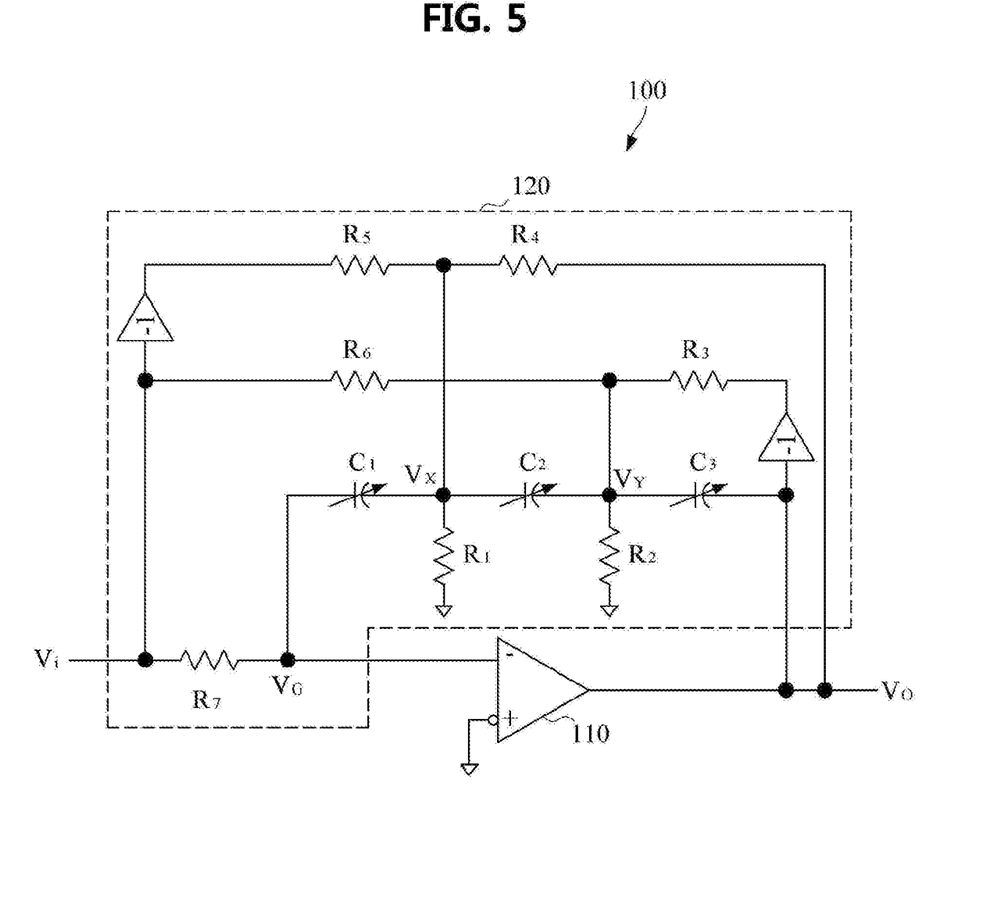
FIG. 5 is a circuit diagram illustrating a third-order loop filter according to an exemplary embodiment of the present disclosure.
Figure 6:
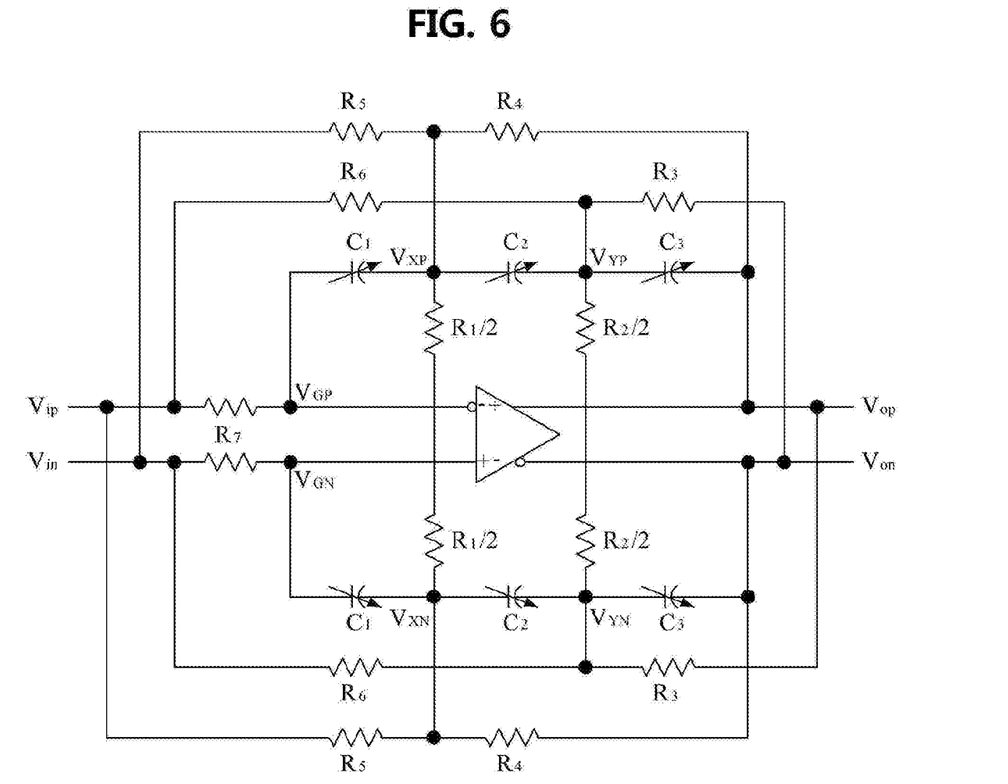
FIG. 6 is a diagram illustrating a third-order loop filter of FIG. 5 as a fully-differential circuit.

FIG. 5 is a circuit diagram illustrating a third-order loop filter according to an exemplary embodiment of the present disclosure, and FIG. 6 is a diagram illustrating a third-order loop filter of FIG. 5 as a fully-differential circuit.

This is, FIG. 5 illustrates a single-ended structure of FIG. 6. In the below description, for convenience of explanation, the third-order loop filter will be explained referring to FIG. 5. The third-order loop filter 100 may comprise a single operational amplifier 110, and an RC network 120 including a plurality of capacitors and a plurality of resistors which are connected to the operational amplifier 110 and satisfy a third-order transfer function. The RC network 120 may comprise three capacitors connected in series, and seven resistors connected in series or in parallel to a virtual ground $V_G$, a first node $V_X$, and a second node $V_Y$ which are internal nodes. At least one of the three capacitors may be a variable capacitor, and at least one of the seven resistors may be a variable resistor. In an exemplary embodiment, all of the three capacitors may be variable capacitors, and all of the seven resistors may be variable resistors.

As illustrated in FIG. 5, between an input end and an output end of the operational amplifier 110, a first capacitor $C_1$, a second capacitor $C_2$, and a third capacitor $C_3$ may be connected in series from the input end to the output end. Also, a first resistor $R_1$, a second resistor $R_2$, a third resistor $R_3$, a fourth resistor $R_4$, a fifth resistor $R_5$, a sixth resistor $R_6$, and a seventh resistor $R_7$ are connected in series or in parallel to the node $V_G$, the first node $V_X$, and the second node $V_Y$. Here, $V_G$ may be a node located in an input line of the operational amplifier 110, $V_X$ may be a node located between $C_1$ and $C_2$, and $V_Y$ may be a node located between $C_2$ and $C_3$.

$R_1$ may be connected between the $V_X$ node and the ground, and $R_2$ may be connected between the $V_Y$ node and the ground. $R_3$ and $R_6$ are connected to the $V_Y$ node, and the $R_4$ and $R_5$ are connected to the $V_X$ node. $R_3$ may be connected between an output line of the operational amplifier 110 and the $V_Y$ node, $R_4$ may be connected between the output line of the operational amplifier 110 and the $V_X$ node, $R_5$ may be connected between the input line of the operational amplifier 110 and the $V_X$ node, and $R_6$ may be connected between the input line of the operational amplifier 110 and the $V_Y$ node. Also, $R_7$ may be located in the input line of the operational amplifier 110, and connected to the $V_G$ node. Like this, the third-order loop filter 100 may be implemented with a single operational amplifier 110, and implement a third-order transfer function through three capacitors and seven resistors connected in series or in parallel to the internal nodes $V_G$, $V_X$, and $V_Y$.

According to the connections of the resistors and capacitors in the RC network 120 illustrated in FIG. 5, an input positive voltage signal Vi may be applied to the $V_Y$ node through $R_6$, an output positive voltage signal Vo may be applied to the $V_X$ node through $R_4$. Also an input negative voltage signal −Vi may be applied to the $V_X$ node through $R_5$, and an output negative voltage signal −Vo may be applied to the $V_Y$ node through $R_3$. Like this, controls on coefficients of the transfer function may be made easy by providing the negative signals.

Also the circuit may be made to operate stably by varying capacitances of the capacitors even when PVT variation exists. Also, external environmental changes may be compensated by varying resistances of the resistors as well as the capacitances. The operational amplifier 110 may use a voltage gain and bandwidth as controlled according to a frequency at which the loop filter 100 operates.

The transfer function Vo/Vi in FIG. 5 may be calculated as shown in the below equation 2.

[Equation 2]

$$s^2\left\{\left(\frac{1}{C_1}+\frac{1}{C_2}+\frac{1}{C_3}\right)\cdot\frac{1}{R_7}+\frac{1}{C_3R_6}-\left(\frac{1}{C_2}+\frac{1}{C_3}\right)\cdot\frac{1}{R_5}\right\}+$$
$$s\left\{\frac{1}{C_1C_2\cdot R_7}\left(\frac{1}{R_1}+\frac{1}{R_3}+\frac{1}{R_5}\right)+\frac{1}{C_2C_3}\cdot\left(\left(\frac{1}{R_2}+\frac{1}{R_4}+\frac{1}{R_6}\right)\cdot\right.\right.$$
$$\left.\left.\left(\frac{1}{R_7}-\frac{1}{R_5}\right)\right)+\frac{1}{C_3C_1\cdot R_7}\left(\frac{1}{R_1}+\frac{1}{R_2}+\frac{1}{R_3}+\frac{1}{R_4}+\frac{1}{R_5}+\frac{1}{R_6}\right)\right\}+$$
$$\frac{\frac{1}{C_1C_2C_3\cdot R_7}\left(\frac{1}{R_1R_2}+\frac{1}{R_1R_4}+\frac{1}{R_1R_6}+\frac{1}{R_2R_3}+\frac{1}{R_2R_5}+\frac{1}{R_3R_4}+\frac{1}{R_3R_6}+\frac{1}{R_4R_5}+\frac{1}{R_5R_6}\right)}{s\cdot\left[s^2+\frac{1}{C_2C_3\cdot R_3}\left(\frac{1}{R_2}+\frac{1}{R_4}+\frac{1}{R_6}\right)\right]}$$

Also, a resonance condition for the second-order term in the denominator may be derived as shown in the below equation 3.

$$(C_2+C_3)\cdot R_4 = C_2\cdot R_3 \quad \text{[Equation 3]}$$

When looking at the above equations, it may be identified that the equations have the same form as that of the third-order transfer function illustrated in FIG. 4. Thus, it can be identified that the circuit in FIG. 5 may represent characteristics of a third-order loop filter by using only a single operational amplifier. Also, in FIG. 5, the second-order term in the numerator may be controlled by $R_5$ and $R_6$, the first-order term in the numerator may be controlled by $R_1$ and $R_6$, and the constant term in the numerator may be controlled by $R_1$ and $R_5$. That is, since respective terms in the numerator can be controlled by different resistors, a condition of coefficients which the transfer function demands may be obtained from variation of resistances in the resistors. Also, the first-order term in the denominator may be controlled by $R_3$ and $R_4$. Also, a resonance condition for eliminating the second-order term in the denominator of the transfer function may be easily controlled by $C_2$ and $C_3$ or by $R_4$ and $R_5$.

Figure 7:
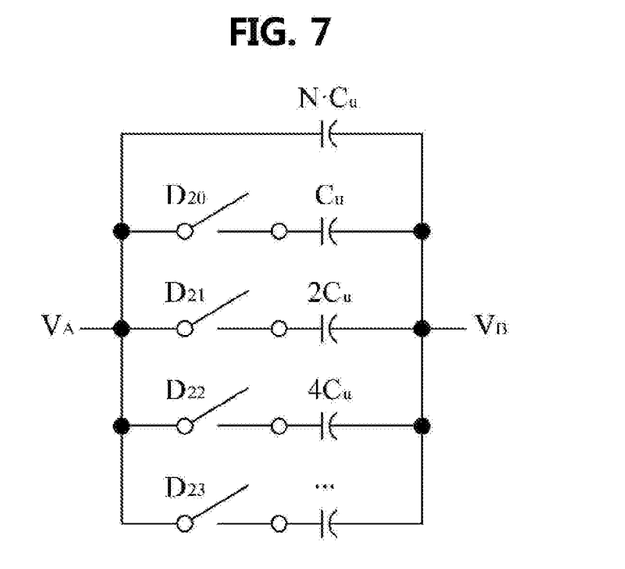
FIG. 7 is a diagram illustrating a variable capacitor according to an exemplary embodiment of the present disclosure.
Figure 8:
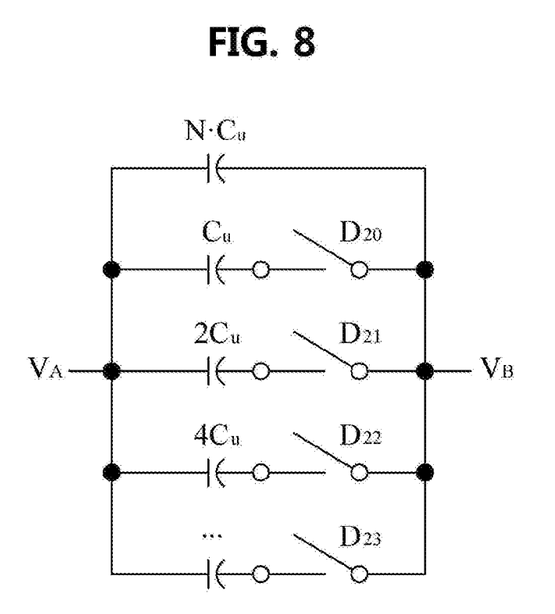
FIG. 8 is a diagram illustrating a variable capacitor according to another exemplary embodiment of the present disclosure.
Figure 9:
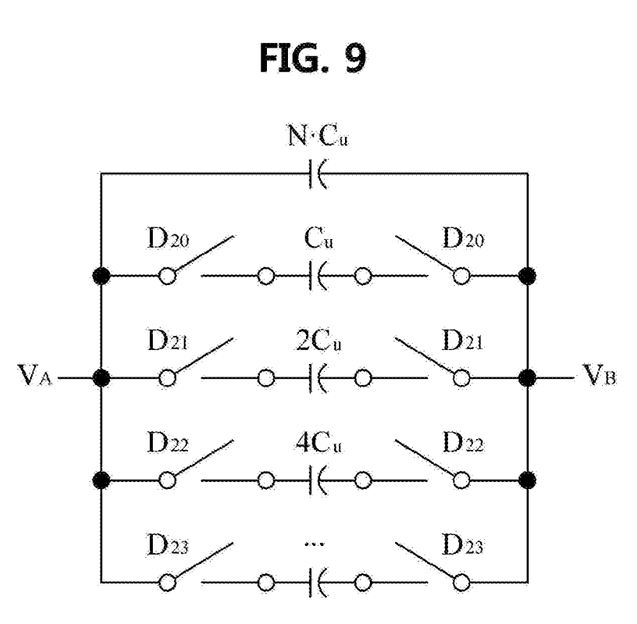
FIG. 9 is a diagram illustrating a variable capacitor according to yet another exemplary embodiment of the present disclosure.

FIG. 7 is a diagram illustrating a variable capacitor according to an exemplary embodiment of the present disclosure, FIG. 8 is a diagram illustrating a variable capacitor according to another exemplary embodiment of the present disclosure, and FIG. 9 is a diagram illustrating a variable capacitor according to yet another exemplary embodiment of the present disclosure.

A variable capacitor may comprise a basic capacitor N·Cu and a compensating capacitor set including at least one compensating capacitor. In an exemplary embodiment, a variable capacitor may comprise a plurality of unit capacitors each of which has the same unit capacitance, in order to enhance matching characteristics of the circuit. Also, the variable capacitor may comprise at least one switch D20, D21, D22, D23 each of which corresponds to each of the compensating capacitors Cu, 2Cu, 4Cu, etc.

As illustrated in FIG. 7, a switch may be located in a front end of each compensating capacitor. Alternatively, as illustrated in FIG. 8, a switch may be located in a back end of each compensating capacitor. Alternatively, as illustrated in FIG. 9, switches may be located in both ends of the compensating capacitor. In an exemplary embodiment, in order to guarantee linearity of a switch, the switch may be located at a place having a smaller swing of a voltage signal thereat. Accordingly, the variable capacitor $C_1$ may be configured as illustrated in FIG. 7, since a voltage signal swing at the $V_X$ node is larger than that of the $V_G$ node which is a virtual ground. Also for the variable capacitors $C_2$ and $C_3$, locations of corresponding switches may be determined in consideration of voltage signal swings at respective ends of them. According to necessity, switches may also be located at both ends of a capacitor as illustrated in FIG. 9. For reference, in FIG. 7, FIG. 8, and FIG. 9, each of $V_A$ and $V_B$ means an arbitrary node.

Figure 10:
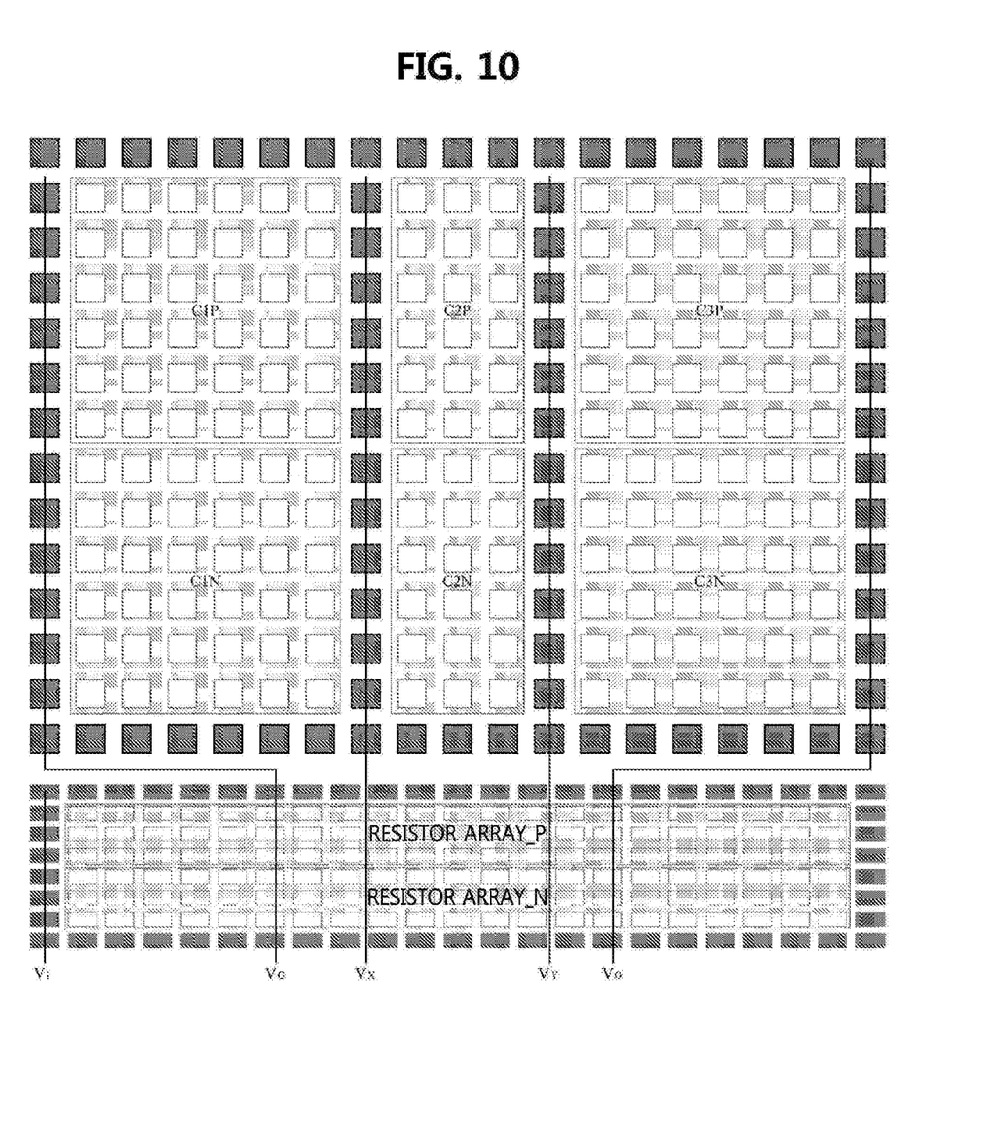
FIG. 10 is a diagram illustrating a layout of a RC network in a third-order loop filter according to an exemplary embodiment of the present disclosure.

FIG. 10 is a diagram illustrating a layout of a RC network in a third-order loop filter according to an exemplary embodiment of the present disclosure.

One of advantages achievable by the third-order loop filter which was described in the above is that a layout for implementing the loop filter can be easily designed. Since the above-described third-order loop filter uses a single operational amplifier and the resistors and capacitors in the RC network are connected with one another, a layout in which rows of the capacitors and rows of the capacitors are adjacently located can be designed. That is, a layout, in which capacitor rows are aggregated with other capacitor rows, and resistor rows are aggregated with other resistor rows, may be made possible. Accordingly, matching characteristics of the whole RC filter can be enhanced. Also, since a layout in which capacitor rows and resistor rows are aggregated together is possible, it becomes possible to implement a circuit having a very small size as compared to the conventional circuit. Meanwhile, black blocks are dummy components used for enhancing characteristics of blocks located in edge regions. That is, the black blocks may be dummy resistors or dummy capacitors. Also, a dummy component existing in capacitor regions may locate a switch in its lower part so as to make it easy to configure a variable capacitor.

Figure 11:
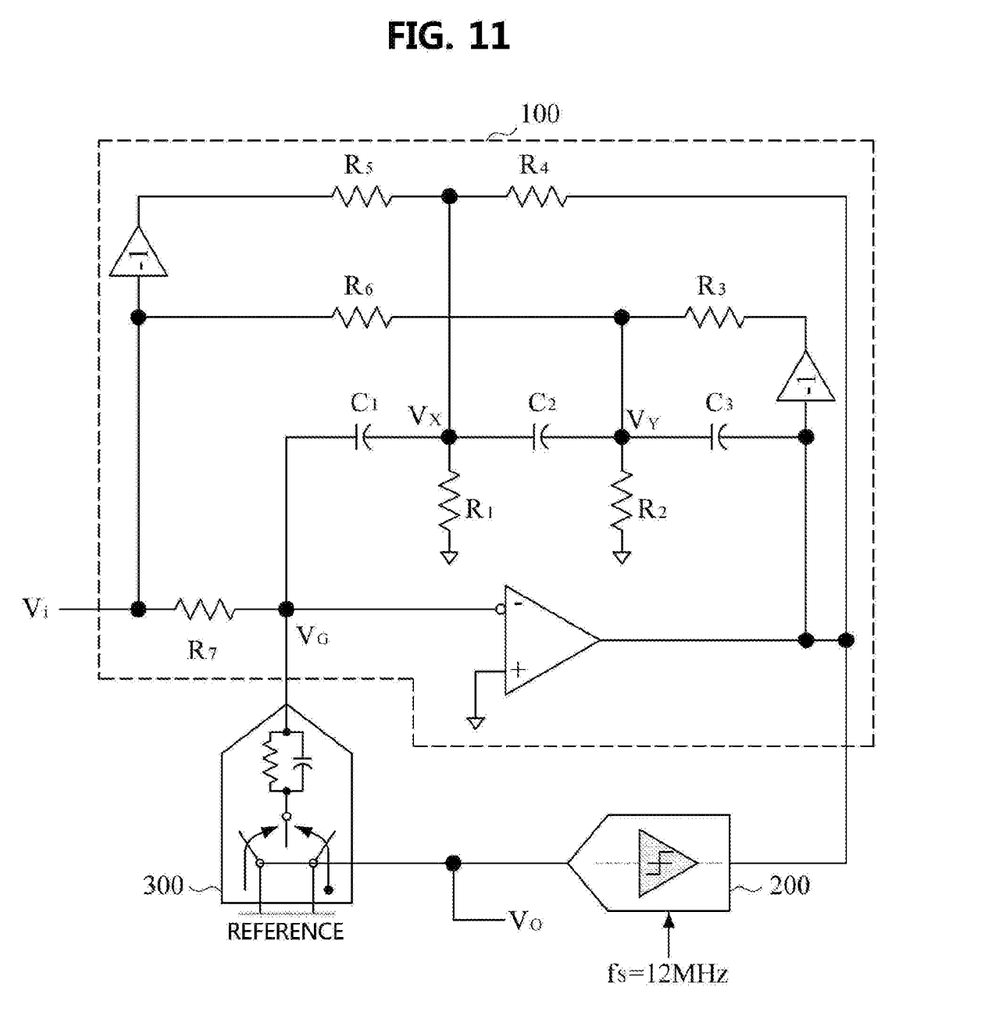
FIG. 11 is a circuit diagram illustrating a delta sigma modulator using a third-order loop filter according to an exemplary embodiment of the present disclosure.

FIG. 11 is a circuit diagram illustrating a delta sigma modulator using a third-order loop filter according to an exemplary embodiment of the present disclosure.

As illustrated in FIG. 11, a delta sigma modulator may comprise a third-order loop filter 100, a comparator 200, and a DAC 300. The third-order loop filter 100 is the same as described. The comparator 200 is a component for comparing an output positive signal with an output negative signal of the third-order loop filter, and may be configured to generate 1-bit output by using a 1-bit comparator circuit. Also, the DAC 300 may be a switched-resistor type DAC, and its output end may be connected to a $V_G$ node of the loop filter 100. The DAC 300 may output a reference positive current or a reference negative current according to the comparison result of the comparator 200. For example, if the output of the comparator 200 is positive, the DAC 300 may output the reference negative current. On the contrary, if the output of the comparator 200 is negative, the DAC 300 may output the reference positive current.

In other words, the delta signal modulator illustrated in FIG. 11 uses the proposed third-order loop filter, generates 1-bit output by using the 1-bit comparator circuit, and uses the switched-resistor type DAC. Also, the delta signal modulator may be configured to process signals within a bandwidth of 150 kHz at an operation clock of 12 MHz. Meanwhile, in the case that the delta sigma modulator is configured with the proposed third-order loop filter 100, a multi-bit circuit may also be used instead of the 1-bit circuit. For convenience of explanation, the simplest case in which the 1-bit comparator is used was explained.

Figure 12:
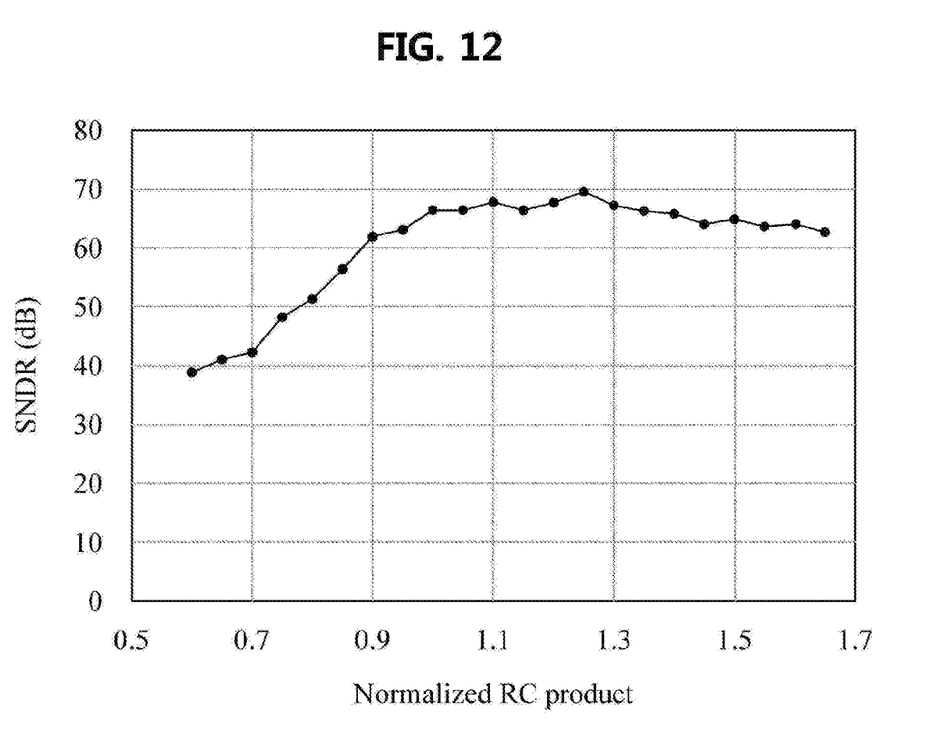
FIG. 12 is a graph illustrating SNDR characteristics according to a change of RC product of a delta sigma modulator using a proposed third-order loop filter.

FIG. 12 is a graph illustrating SNDR characteristics according to a change of RC product of a delta sigma modulator using a proposed third-order loop filter.

That is, FIG. 12 illustrates signal-to-noise and distortion ratio (SNDR) of the delta sigma modulator according to changes of resistors and capacitors in the loop filter. Referring to FIG. 12, it can be identified that the SNDR is maintained above 60 dB and the loop filter operates stably, even when the RC product changes from 0.9 times to 1.7 times. However, it can be identified that the SNDR decreases gradually when the RC product is not larger than 0.9 times, but this may be general observation in usual delta sigma modulators. Also, this can be controlled by adjusting the variable capacitor row.

Figure 13:
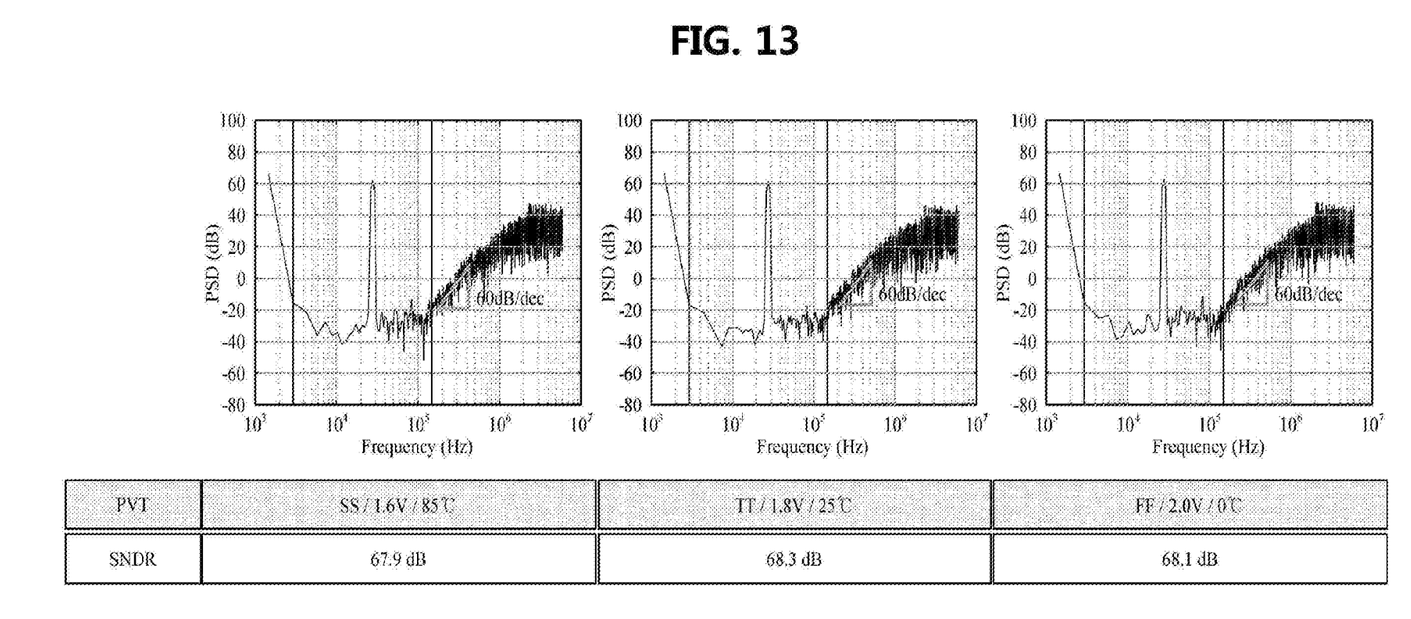
FIG. 13 is a diagram illustrating a simulation result of a delta sigma modulator using a proposed third-order loop filter.

FIG. 13 is a diagram illustrating a simulation result of a delta sigma modulator using a proposed third-order loop filter.

The usefulness of the loop filter circuit may be identified through a Fast Fourier Transform (FFT) result of the proposed delta sigma modulator. FIG. 13 illustrates a simulation result of a third-order 2-level delta sigma modulator. This simulation result is a result obtained by capturing waveforms outputted from the delta signal modulator after application an input of 25 kHz to the delta sigma modulator, and performing the captured waveforms. In order to raise reliability of the simulation, the simulation was performed as a pot-layout simulation by adding parasitic components after layout. Also, further efforts to raise the reliability are made by varying process conditions such as Slow-Slow (SS), Typical (TT), and Fast-Fast (FF), operating voltages such as 1.6V, 1.8V, and 2.0V, and operation temperatures such as 85° C., 25° C., and 0° C. In the simulation result, noise transfer functions for all the three cases operate with a slope of 60 dB/decade, which means that the proposed third-order loop filter operates normally.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A third-order loop filter comprising:
an operational amplifier; and
a resistor-capacitor network including a plurality of capacitors and a plurality of resistors, which are connected to the operational amplifier and satisfy a third order transfer function,
wherein the resistor-capacitor network includes a first capacitor, a second capacitor and a third capacitor, which are connected in series from an input end of the operational amplifier to an output end of the operational amplifier, and a first set of resistors including a first resistor, a third resistor and a fifth resistor, which are connected to a first node, and a second set of resistors including a second resistor, a fourth resistor and a sixth resistor, which are connected to a second node, and
wherein the first node is a node between the first capacitor and the second capacitor, and the second node is a node between the second capacitor and the third capacitor.

2. The third-order loop filter according to claim 1, wherein at least one of the first capacitor, second capacitor, and third capacitor is a variable capacitor, and at least one of the first resistor, second resistor, third resistor, fourth resistor, fifth resistor, and sixth resistor is a variable resistor.

3. The third-order loop filter according to claim 2, wherein a resonance condition is controlled by varying the second capacitor and the third capacitor, or variation of the third resistor and the fourth resistor.

4. The third-order loop filter according to claim 2, wherein coefficients of the transfer function are controlled by varying the variable resistor.

5. The third-order loop filter according to claim 4, wherein a second-order term in a numerator of the transfer function is controlled by varying the fifth resistor and the sixth resistor, a first-order term in the numerator is controlled by varying the first resistor and the sixth resistor, a constant term in the numerator is controlled by varying the first resistor and the fifth resistor, and a first-order term in a denominator in the transfer function is controlled by varying the third resistor and the fourth resistor.

6. The third-order loop filter according to claim 2, wherein the variable capacitor comprises a plurality of capacitors based on same unit capacitance, which are connected in parallel and include a basic capacitor and at least one compensating capacitor, and at least one switch which is located in at least one of one end and another end of the at least one compensating capacitor.

7. The third-order loop filter according to claim 1, wherein an input negative voltage signal and an output positive voltage signal are applied to the first set of resistors.

8. The third-order loop filter according to claim 7, wherein the first resistor is connected between the first node and a ground, the input negative voltage signal is applied to the fifth resistor, and the output positive voltage signal is applied to the third resistor.

9. The third-order loop filter according to claim 1, wherein an input positive voltage signal and an output negative voltage signal are applied to the second set of resistors.

10. The third-order loop filter according to claim 9, wherein the second resistor is connected between the second node and a ground, the input positive voltage signal is applied to the sixth resistor, and the output negative voltage signal is applied to the fourth resistor.

11. A delta sigma modulator comprising:
a third-order loop filter;
a comparator for comparing an output positive signal with an output negative signal of the third-order loop filter; and
a digital-to-analog converter for outputting a reference positive current and a reference negative current to the third-order loop filter according to comparison result of the comparator,
wherein the third-order loop filter comprises:
an operational amplifier; and
a resistor-capacitor network located between an input end and an output end of the operational amplifier,
wherein the resistor-capacitor network includes a first capacitor, a second capacitor and a third capacitor, which are connected in series from the input end to the output end, and a first set of resistors including a first resistor, a third resistor and a fifth resistor, which are connected to a first node, and a second set of resistors including a second resistor, a fourth resistor and a sixth resistor, which are connected to a second node, and
wherein the first node is a node between the first capacitor and the second capacitor, and the second node is a node between the second capacitor and the third capacitor.

12. The delta sigma modulator according to 11, wherein at least one of the first capacitor, second capacitor, and third capacitor is a variable capacitor, and at least one of the first resistor, second resistor, third resistor, fourth resistor, fifth resistor, and sixth resistor is a variable resistor.

13. The delta sigma modulator according to 12, wherein a resonance condition is controlled by varying the second capacitor and the third capacitor, or varying the third resistor and the fourth resistor.

14. The delta sigma modulator according to 12, wherein coefficients of the transfer function are controlled by varying the variable resistor.

15. The delta sigma modulator according to 12, wherein a second-order term in a numerator of the transfer function is controlled by varying the fifth resistor and the sixth resistor, a first-order term in the numerator is controlled by varying the first resistor and the sixth resistor, a constant term in the numerator is controlled by varying the first resistor and the fifth resistor, and a first-order term in a denominator in the transfer function is controlled by varying the third resistor and the fourth resistor.

16. The delta sigma modulator according to 12, wherein the variable capacitor comprises a plurality of capacitors based on same unit capacitance, which are connected in parallel and include a basic capacitor and at least one compensating capacitor, and at least one switch which is located in at least one of one end and another end of the at least one compensating capacitor.

* * * * *